(12) United States Patent
Stone et al.

(10) Patent No.: US 9,367,648 B2
(45) Date of Patent: Jun. 14, 2016

(54) SPECIFICATION-GUIDED USER INTERFACE FOR OPTICAL DESIGN SYSTEMS

(71) Applicant: Synopsys, Inc., Mountain View, CA (US)

(72) Inventors: Bryan D. Stone, Westborough, MA (US); Joseph D. Wilson, Pasadena, CA (US); John Rice Rogers, Monrovia, CA (US); Jeffrey Mathew Hoffman, Birmingham, MI (US); James Patrick McGuire, Jr., Pasadena, CA (US)

(73) Assignee: Synopsys, Inc., Mountain View, CA (US)

( * ) Notice: Subject to any disclaimer, the term of this patent is extended or adjusted under 35 U.S.C. 154(b) by 465 days.

(21) Appl. No.: 13/804,146

(22) Filed: Mar. 14, 2013

(65) Prior Publication Data

US 2014/0278263 A1    Sep. 18, 2014

(51) Int. Cl.
*G06F 17/50* (2006.01)

(52) U.S. Cl.
CPC .................................. *G06F 17/50* (2013.01)

(58) Field of Classification Search
CPC ........................................................ G06F 17/50
USPC ............................................................... 703/1
See application file for complete search history.

(56) References Cited

U.S. PATENT DOCUMENTS

| | | | | |
|---|---|---|---|---|
| 5,563,807 A * | 10/1996 | Kashiwagi et al. | | 702/127 |
| 5,861,114 A * | 1/1999 | Roffman et al. | | 264/2.5 |
| 8,249,837 B1 * | 8/2012 | Prabhu et al. | | 703/2 |
| 2006/0161410 A1 * | 7/2006 | Hamatani et al. | | 703/13 |
| 2007/0225847 A1 * | 9/2007 | Pietsch et al. | | 700/98 |
| 2009/0025783 A1 * | 1/2009 | Wernham et al. | | 136/256 |
| 2011/0288824 A1 * | 11/2011 | Bietry et al. | | 703/1 |
| 2012/0130521 A1 * | 5/2012 | Kohlhoff | | 700/98 |

* cited by examiner

*Primary Examiner* — Dwin M Craig
(74) *Attorney, Agent, or Firm* — Fenwick & West LLP

(57) ABSTRACT

An optical design system generates a design state overview of a design of an optical system, the design state overview summarizing a current state and a target state of the design by describing a plurality of specifications for the optical system, the specification descriptions including target ranges for the specifications based on the target state of the design and further including current values for the specifications based on the current state of the design. The optical design system displays the design state overview. The optical design system updates the design state overview in response to the optical design system changing the current design for the optical system.

39 Claims, 11 Drawing Sheets

Design State Overview

| Active | Description | Mode | Target | Range (+/-) | Calculated Value |
|---|---|---|---|---|---|
| ☑ | Magnification | = | 1 | 0.1 | 1.04 |
| ☑ | Semi field of view | = | 25 | 2 | 20 |
| ☑ | EFL | = | 50 | 2 | 50.00 |
| ☑ | Image Clearance | > | 30 | 0 | 43.07 |
| ☑ | Numerical Aperture | = | 0.1 | 0.05 | 0.11 |
| ☑ | Image Telecentricity | = | 0 | 0.1 | 0.32 |
| ☑ | Transmission | > | 80 | 0 | 82 |
| ☑ | Relative Illumination | > | 60 | 0 | 68 |
| ☑ | Largest Element Diameter | < | 25 | 0 | 24 |
| ☑ | Total Weight | < | 600 | 0 | 556 |
| ☑ | Average MTF | > | 0.3 | 0 | 0.32 |
| ☑ | Mn MTF | > | 0.2 | 0 | 0.25 |
| ☑ | RMS Wavefront | < | 0.1 | 0 | 1.2 |
| ☑ | Strehl Ratio | > | 0.7 | 0 | 0.73 |
| ☑ | Vergence Error | < | 5 | 0 | 4.3 |
| ☑ | Distortion | < | 3 | 0 | 3.1 |
| ☑ | Detection Max Angle | < | 20 | 0 | 17.3 |
| ☑ | Overall Length | < | 140 | 0 | 138 |
| ☐ | Total Cost | < | 300 | 0 | 293 |
| ☑ | # of Aspheres | < | 4 | 0 | 3 |

Find Starting Design

Optimize

Tolerance

Generate Report

Edit

Update

FIG. 4

| Description | 1 | 2 | 3 |
|---|---|---|---|
| EFL (mm) | 51 | 50 | 48 |
| Clearance | 40 | 44 | 33 |
| NA (mm) | .1 | .2 | .15 |
| FOV (deg) | 20 | 22 | 21 |
| Magnification | 1 | 1.1 | 1.3 |
| Telecentricity (deg) | 0 | .1 | .2 |

**SPECIFICATIONS
PRELIMINARY OPTICAL DESIGN OF A
MICROSCOPE OBJECTIVE
(DATE)**

| SPECIFICATION | REQUIREMENT/GOAL | VALUE |
|---|---|---|
| 1. Configuration | Metallurgical-type microscope objective. Infinity corrected, no cover glass, mostly spherical surfaces, but one aspheric surface may be used if it reduces the number of elements by two | |
| 2. Focal Length (mm) | x.x ± x.xx | |
| 3. Numerical aperture | x.xx | |
| 4. Object plane full field of view (mm) | x.xx | |
| 5. Wavelengths and weighting<br>(a) Wavelength<br><br>(b) Spectral bandwidth<br>(c) Spectral weighting | (a) xxx.xxx ± x.xxx nm in vacuum;<br><br>(b) < xx GHZ (± x.xx pm FWHM)<br>(c) Lambda (nm)   Weight<br>    xxx.xxxxx      1<br>    xxx.xxxxx      5<br>    xxx.xxxxx    10<br>    xxx.xxxxx      5<br>    xxx.xxxxx      1 | |
| 6. Polarization | Circular (reference only) | |
| 7. Source power | < xx mW average power (reference | |
| ⋮ | ⋮ | ⋮ |

FIG. 6

SPECIFICATION-GUIDED USER INTERFACE FOR OPTICAL DESIGN SYSTEMS

BACKGROUND

1. Field of Disclosure

This disclosure relates to the field of optical design systems generally, and specifically to improved user interfaces for optical design systems.

2. Description of the Related Art

Presently, optical computer aided design (CAD) systems rely on a user to progress through various stages of designing an optical system and act as a computational engine during the design process. Additionally, these optical design systems offer many ways in which a user can define or adjust the design parameters of the design for an optical system, and the user interfaces for these optical design systems can be very complex. As a result, new users may find it difficult to use these optical design systems. Moreover, even for experienced users, the complexity of the interfaces can make developing an optical design via one of these systems very inefficient.

SUMMARY

An optical design system performs a method including the steps of generating a design state overview of the design of the optical system, the design state overview summarizing a current state and a target state of the design by describing a plurality of specifications for the optical system, the specification descriptions including target ranges for the specifications based on the target state of the design and further including current values for the specifications based on the current state of the design. The optical design system displays the design state overview. The optical design system updates the design state overview in response to the optical design system changing the current design for the optical system.

BRIEF DESCRIPTION OF DRAWINGS

FIG. 4 illustrates an example design state overview according to one embodiment.

FIG. 6 illustrates an example optical design report describing an optical design according to one embodiment.

DETAILED DESCRIPTION

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

Figure 1:
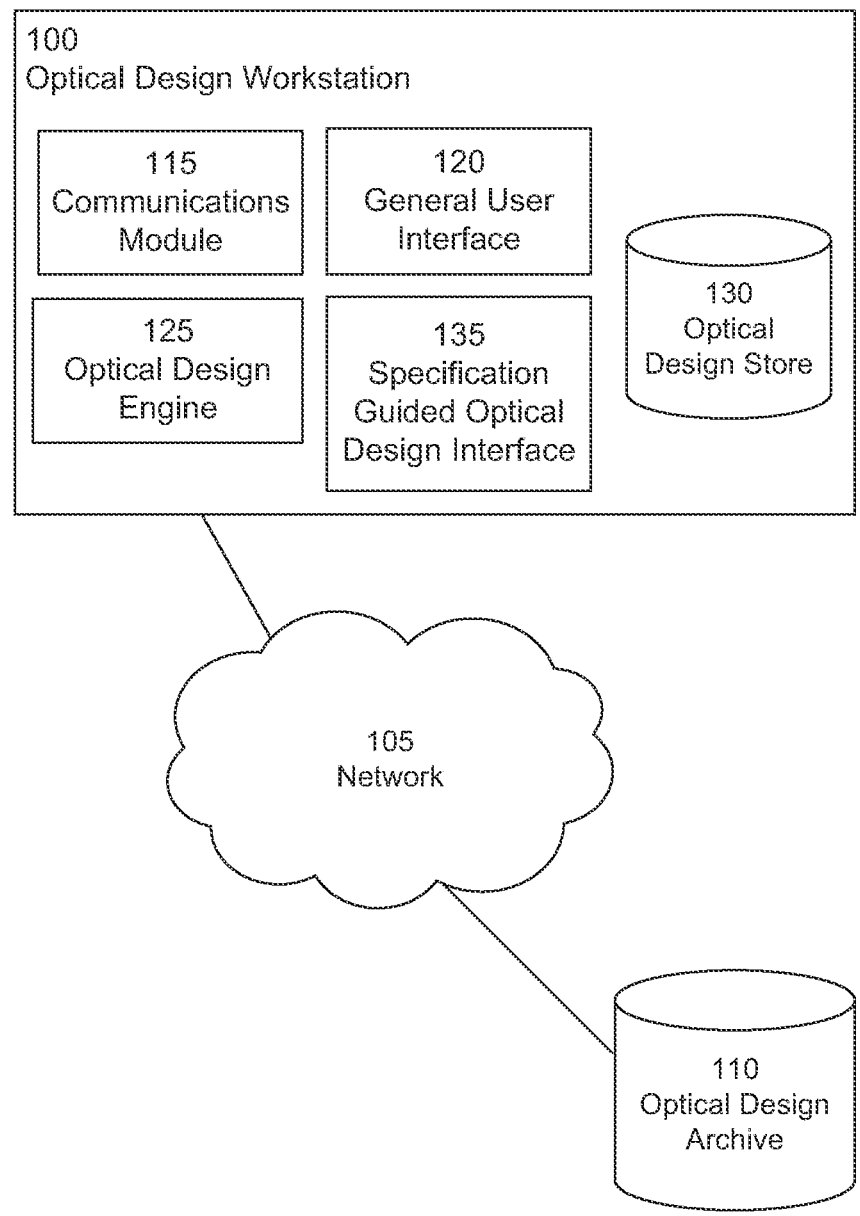
FIG. 1 is a high-level block diagram illustrating an embodiment of an optical design system for designing an optical system using a specification guided optical design interface.

FIG. 1 is a high-level block diagram illustrating an embodiment of an optical design system for designing an optical system using a specification guided optical design interface. The system includes an optical design workstation 100 connected by a network 105 to an optical design archive 110. Here only one optical design workstation 100 and optical design archive 110 are illustrated but there may be multiple instances of each of these entities. For example, an optical design workstation 100 may be in communication with multiple optical design archives 110.

The network 105 provides a communication infrastructure between the optical design workstation 100 and the optical design archive 110. The network 105 is typically the Internet, but may be any network, including but not limited to a Local Area Network (LAN), a Metropolitan Area Network (MAN), a Wide Area Network (WAN), a mobile wired or wireless network, a private network, or a virtual private network. Here, the network 105 provides communications between the optical design workstation 100 and the optical design archive 110, but it can also provide communications between other components in other architectures of the optical design system. For example, the components 115-135 may be implemented on separate devices rather than on a single workstation and network 105 can provide communications between these components.

The optical design archive 110 stores optical designs, including those that can be used as starting points for the design of various optical systems. For example, the optical design archive 110 may contain designs for many different types of microscopes, which can then be used as the starting point for a new microscope design.

Each optical system typically is defined by a set of specifications. Each specification typically defines a requirement to be met by an optical design. There can be many different types of specifications: optical, mechanical, manufacturability, environmental, reliability, performance, cost, etc. Optical specifications describe the optical characteristics of an optical design. Typical optical specifications for imaging applications include, for example, focal length, numerical aperture, magnification, transmission, field of view, aperture sizes, wavelength band, object distance, image distance, and measures of optical performance (e.g., transverse ray aberration, spot size, wavefront error, Zernike coefficient(s) associated with the wavefront(s), modulation transfer function (MTF), encircled energy diameter, fiber coupling efficiency, field curvature, distortion, chromatic aberration, etc.). For non-imaging applications, typical optical specifications include efficiency, surface finishes, material properties, tolerance restrictions, and measures of optical performance (e.g., radiometric intensity, luminous intensity, illuminance, irradiance, and color temperature). Mechanical specifications describe the physical characteristics of an optical design. Typical mechanical specifications include, for example, maximum number of elements, size (length, diameter, or volume), working distance, and weight. Manufacturability specifications describe the characteristics that effect manufacture of devices based on the optical design. Typical manufacturability specifications include, for example, allowable tolerances for optical system component dimensions or quality such as center thickness, radius of curvature, wedge, or surface irregularity; material properties such as index of refraction, Abbe number, or index inhomogeneity; or alignment errors such as element decentration or tilt, adjustment precision, or boresight error; etc. Environmental specifications describe the environment of the optical design. Typical environmental specifications include, for example, operating temperature range, vibration, pressure, medium (e.g., gas, fluid, vacuum), humidity, etc. Reliability specifications describe the reliability of the optical design. Typical reliability specifications include, for example, life cycle or environmental testing for design elements, mean time between failures, etc. Cost specifications describe the cost associated with the optical design. Typical cost specifications include, for example, cost per element, material costs, labor costs, total cost per optical design.

Specifications may broadly be classified as first order or beyond first order. First order specifications are specifications on the paraxial or parabasal properties of optical systems. First order specifications are present in most designs of a particular application. First order specifications for an imaging application may be, for example, effective focal length, numerical aperture, working distance, or field of view. In contrast, specifications beyond the first order are specifications whose inclusion is dependent on the optical design. For example, RMS wavefront error, Zernike coefficient(s) associated with the wavefront(s), modulation transfer function, point spread function based centroid distortion, or fiber coupling efficiency.

Specifications can be described using different types of data constructs. In one approach, specifications are described using a set of fields, for example, a specification name to give a label to the specification; and a comparison operator (>, < or =), target value and/or range to define the required values for the specification. As handled by the optical design system, specification descriptions can also include the current value of the specification based on the current optical design, an active flag to determine whether the specification is an active specification for the current design, and design metadata. Design metadata may include design name, design identification, design description, identification of the designer(s), date(s) and designs on which the current design is based.

In one implementation, the optical design archive 110 is configured to receive optical design requests from the optical design workstation 100, process those requests, and return one or more candidate optical designs from the archive. The optical design request can include specification information and the optical design archive 110 is configured to retrieve candidate optical designs based on the specification information within the optical design request. For example, the optical design archive 110 may be configured to retrieve one or more candidate optical designs using a lookup table that indexes candidate optical designs by specification.

The optical design workstation 100 is a computing device that executes computer program modules which allow a user to perform computer aided design of optical systems. An optical design workstation 100 might be, for example, a personal computer, a tablet computer, a laptop computer, etc. Some embodiments of the optical design workstation have different modules than those described here. Similarly, the functions can be distributed among the modules in a different manner than is described here. The optical design workstation 100 comprises a communications module 115, a general user interface 120, an optical design engine 125, optical design store 130, and a specification guided optical design interface 135 in one embodiment.

The communications module 115 communicates data between the optical design workstation 100 and the optical design archive 110, via the network 105. The communications module 115 sends optical design requests, via the network 105, to the optical design archive 110. Additionally, the communications module 115 may receive one or more candidate optical designs from the optical design archive 110.

The general user interface 120 provides a mechanism for users to create and modify one or more optical designs. Changes to specifications made via the general user interface 120 may be passed to the optical design engine 125, the optical design store 130, the specification guided optical design interface 135, or some combination thereof. Additionally, optical designs may be retrieved and/or stored from the optical design store 130 via the general user interface 120.

The optical design engine 125 modifies (e.g., creates, edits, deletes, or some combination thereof) optical designs. The optical design engine 125 may modify an optical design using design information received from, for example, the general user interface 120, the specification guided optical design interface 135, the optical design archive 110, or some combination thereof. Design information includes, for example, one or more specification descriptions associated with the optical design.

The optical design engine 125 is configured to retrieve, modify, and/or store optical designs in the optical design store 130. In some embodiments, after the optical design engine 125 updates an optical design (e.g., updates a calculated value for a specification), the optical design engine 125 automatically provides one or more updated table entries to the specification guided optical design interface 135.

The optical design engine 125 may create one or more candidate optical designs for optical systems using design information retrieved from the specification guided optical design interface 135. The optical design engine 125 creates one or more candidate optical designs by starting with a baseline optical design or with a randomly generated or otherwise automatically generated optical design that includes suitable lens parameter variables, generating a set of optimization constraints and targets based on design information retrieved from the user or from the specification guided optical design interface 135, and then using an automated process to synthesize and optimize new design forms or otherwise perform guided searches for candidate optical systems.

Additionally, the optical design engine 125 may update an optical design using design information received from the specification guided optical design interface 135. The optical design engine 125 accesses the optical design and calculates one or more current values for specifications based on the received design information. The optical design engine 125 may change the optical design in an attempt to maximize the number of specifications that meet their corresponding requirements. Additionally, in some embodiments, the optical design engine 125 may vary aspects of the design information associated with various specifications during the calculation process to maximize the number of specifications that are met. The optical design engine 125 then returns updated design information to the specification guided optical design interface 135.

Additionally, in some embodiments, the optical design engine 125 updates the design information using the one or more optimization parameters. Optimization parameters are parameters which control how the optical design engine optimizes a particular optical design. For example, optimization parameters may include variables which can be varied during the optimization, constraints on the optimization, figure of merit for the optimization, the method used for optimization, or some combination thereof. Optical variables are design information which the optical design engine 125 is allowed to vary during the optimization process. Optical constraints may include ranges for the optical variables as well as targets or ranges for other optimization parameters. A figure of merit is a quantity used to characterize the performance of an optical design. For example, a figure of merit may be resolution at an image sensor, signal-to-noise ratio, etc. Additionally, figures of merit for imaging applications may include, for example, transverse ray aberration, wavefront error variance, fiber coupling efficiency, modulation transfer function, distortion, or some combination thereof. And for non-imaging applications, figures of merit may include, for example, radiometric intensity, luminous intensity, illuminance, irradiance, and color temperature, or some combination thereof.

The optical design store 130 is a database that stores one or more optical designs, including those that can be possibly used as starting points for the design of various optical systems, one or more design state templates, or some combination thereof. The optical design(s) can be for one or more optical systems. For example, the optical design store 130 could store multiple design iterations for a particular optical system and/or designs for many different optical systems. The optical design store 130 is configured to provide one or more optical designs and/or one or more design state templates to the optical design engine 125, the specification guided optical design interface 135, or both.

The specification guided optical design interface 135 presents a design state overview (or other form of specification summary) to a user of the optical design workstation 100. The design state overview summarizes a current state and a target state of an optical design by describing a plurality of specifications for the optical system. The current state of the design includes calculated values for one or more specifications. The target state includes values for one or more goals for the one or more specifications. The design state overview presents the specifications of the optical design to a user of the optical design workstation 100. Additionally, the design state overview may be used by other modules of the optical design workstation 100 to identify/create design starting points, create design process suggestions, execute design optimization, analyze design performance, analyze tolerances, and generate final reports. Thus, the design state overview enables the system to drive and track the design process by incorporating the specifications of the design into the design state overview. One example of a design state overview is described in detail below in connection with FIGS. 3 and 4.

Additionally, in some embodiments, at the beginning of a design process, the specification guided optical design interface 135 presents a user of the optical design workstation 100 with one or more different candidate design state templates for selection. The specification guided optical design interface 135 is configured to receive from the user a selection of one of the candidate design state templates and generate the design state overview using the selected candidate design state template.

In alternate embodiments, the optical design workstation 100 is connected to one or more client devices (not shown) via network 105. In this embodiment, the client device(s) may include one or more of the modules (e.g., specification guided optical design interface module 135). For example, the client device may include the general user interface 120 and the specification guided optical design interface 135, while the optical design workstation 100 includes the remaining modules. Additionally, in some embodiments, the client device may access the general user interface 120 and the specification guided optical design interface 135 via, for example, a web browser.

Figure 2:
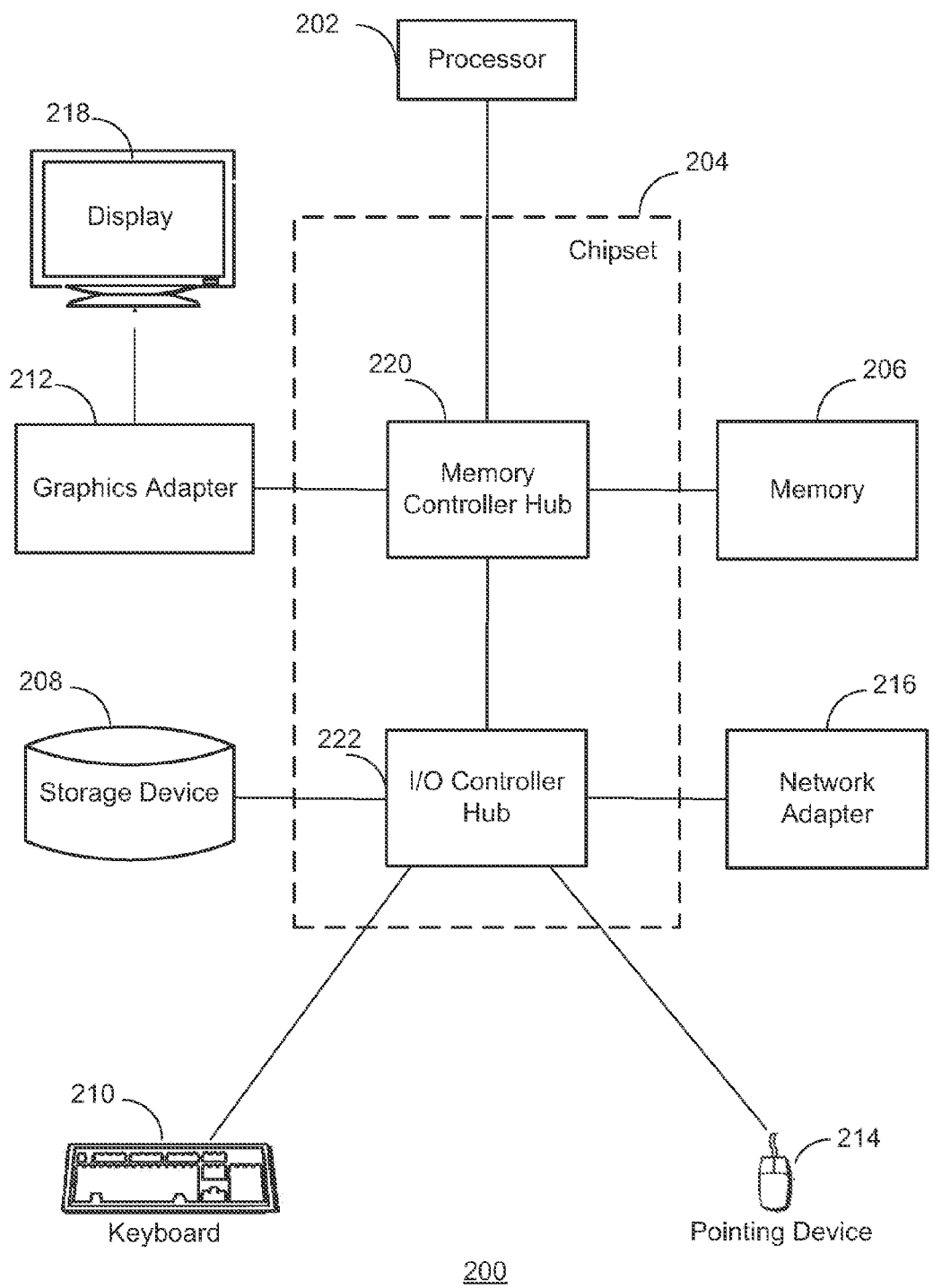
FIG. 2 is a high-level block diagram illustrating an example computer for implementing the entities shown in FIG. 1.

FIG. 2 is a high-level block diagram illustrating an example computer 200 for implementing the entities shown in FIG. 1. The computer 200 includes at least one processor 202 coupled to a chipset 204. The chipset 204 includes a memory controller hub 220 and an input/output (I/O) controller hub 222. A memory 206 and a graphics adapter 212 are coupled to the memory controller hub 220, and a display 218 is coupled to the graphics adapter 212. A storage device 208, keyboard 210, pointing device 214, and network adapter 216 are coupled to the I/O controller hub 222. Other embodiments of the computer 200 have different architectures.

The storage device 208 is a non-transitory computer-readable storage medium such as a hard drive, compact disk read-only memory (CD-ROM), DVD, or a solid-state memory device. The memory 206 holds instructions and data used by the processor 202. The pointing device 214 is a mouse, track ball, or other type of pointing device, and is used in combination with the keyboard 210 to input data into the computer 200. The graphics adapter 212 displays images and other information on the display 218. The network adapter 216 couples the computer 200 to one or more computer networks.

The computer 200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 208, loaded into the memory 206, and executed by the processor 202.

The types of computers 200 used by the entities of FIG. 1 can vary depending upon the embodiment and the processing power required by the entity. For example, the optical design workstation 100 can run in a single computer 200 or multiple computers 200 communicating with each other through a network such as in a server farm. In some embodiments, the computers 200 can lack some of the components described above, such as keyboards 210, graphics adapters 212, and displays 218.

Figure 3:
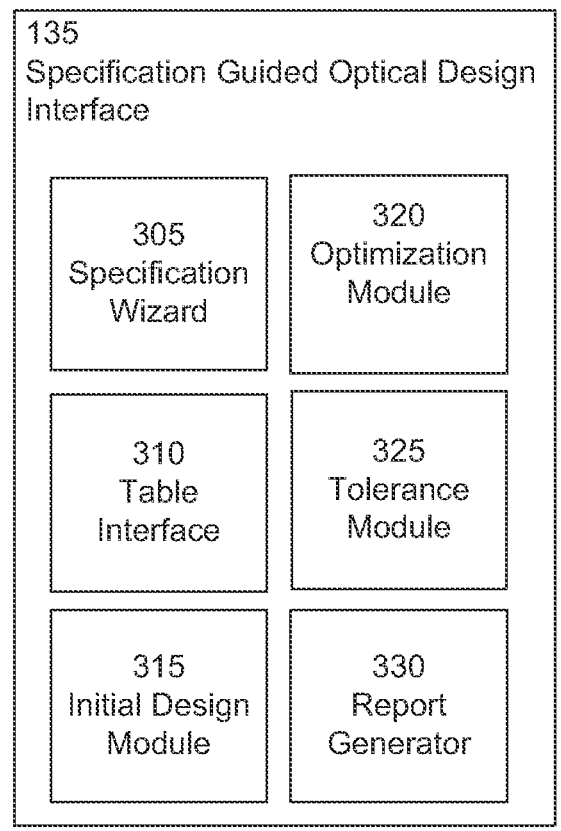
FIG. 3 is a high-level block diagram illustrating a detailed view of modules within a specification guided optical design interface included in an optical design workstation according to one embodiment.

FIG. 3 is a high-level block diagram illustrating a detailed view of modules within the specification guided optical design interface 135 included in the optical design workstation 100 according to one embodiment. The specification guided optical design interface 135 is comprised of modules including a specification wizard 305, a table interface 310, an initial design module 315, an optimization module 320, a tolerance module 325, and a report generator 330. Some embodiments of the specification guided optical design interface 135 have different modules than those described here. For example, some of the functions described here may be implemented in the optical design engine 125. Additionally, the functions can be distributed among the modules in a different manner than is described here.

The specification wizard 305 presents to a user of the optical design workstation 100 one or more different candidate design state templates for selection. A design state template is a high level template for a particular optical design. Candidate design state templates may include broad categories such as relay, afocal, objective, imaging, non-imaging, etc., or may be application-specific categories, such as achromat, eyepiece, telephoto, fisheye, zoom, fiber coupler, f-theta, unobscured reflective telescope, lens array homogenizer, etc. Additionally, once a candidate design state template has been selected, the specification wizard 305 can provide targeted guidance for the user in developing an optical design based on the selected design state template.

Each design state template includes one or more specifications that are appropriate for that type of optical system. Additionally, each design state template typically includes a different combination of specifications and associated design information. For example, a design state template for a relay system may include specifications for object height, lateral magnification, working distance, total track length, and MTF in cycles/mm, whereas a design state template for an afocal system may include specifications for object field angle, angular magnification, intermediate image diameter, exit pupil location, entrance to exit pupil distance, and MTF in cycles/arcmin.

Additionally, one or more of the specifications included in each design state template may include incomplete design information. The incomplete information may later be entered via a design state overview by the user. For example, a design state template may include a magnification specification but without a target value filled in. In some embodiments, the specification wizard 305 may populate the design information of one or more specifications associated with the selected design state template with suggested values. Likewise, a user of the optical design workstation 100 may edit one or more of the design state templates such that the design information is automatically populated with one or more predetermined values. For example, a user may instruct the design state overview wizard 305 to set the magnification of any imaging template to 2, such that when an imaging template is selected in the future the magnification value in the design information is set to 2.

The specification guided optical design interface 135 is configured to receive from the user a selection of one of the candidate design state templates. The specification wizard 305 retrieves the selected candidate design state template from the optical design store 130 and provides it to the table interface 310.

The table interface 310 generates a design state overview that describes an optical design based on the selected candidate design state template. The design state overview summarizes a current state and a target state of the optical design by describing a plurality of specifications. The table interface 310 extracts one or more specifications from the selected candidate design state template. The table interface 310 then populates a design state overview with the extracted specifications. Specifically, the table interface 310 populates the design state overview with some or all of the design information associated with each specification. In alternate embodiments, the table interface 310 generates a design state overview based on design information entered by the user without using a candidate design state template.

In some embodiments, the design state overview includes both first order specifications for an optical design, specifications beyond those of the first order, or some combination thereof. Thus, by combining both first order specifications with specifications beyond those of the first order, the design state overview is able to present to the user a substantially more comprehensive summary of the optical design than other optical design software systems.

Moreover, the design state overview may include, for example, the majority of, substantially all of, or all of the specifications used to describe the state of an optical design. A design state overview that includes all of the specifications fully describes the state of an optical design. An optical design state is fully described if it includes target values and values that represent the current state of the design for all of the specifications. A design state overview that includes substantially all of the specifications includes ninety percent or more of all of the specifications needed to fully describe the optical design. A design state overview that includes a majority of the specifications includes more than half of all of the specifications needed to fully describe the optical design.

Optical designs are often approached in phases, e.g., Feasibility, Preliminary Design, and Final Design. The Feasibility phase only includes the most important specifications, and these are mostly goals. During the Feasibility phase the user is generally trying to determine roughly what can be achieved or whether a concept is worth pursuing further. It is during the Feasibility phase that the design state overview might include the majority of the specifications needed to fully describe the optical design. The Preliminary Design phase is one where the user might be deliberately trying to meet substantially all of the specifications needed to fully describe the optical design. In the Preliminary Design phase the user is generally not worried about every detail (e.g., might not include specific tolerance values, desired minimum element spacings, preferred glass or housing material types, etc.), however, the user may finish the design and do a representative tolerance analysis and report the results. During the Final Design phase the design state overview generally includes all of the specifications needed to fully describe the optical design.

The table interface 310 presents a design state overview to the user. The design state overview includes one or more specifications for the optical system being designed. The table interface 310 allows a user to modify (i.e., add to, edit, or delete from) specifications and their associated design information in the design state overview. For example, the table interface 310 allows a user to add a specification associated with cost of the optical design, edit the magnification value of the optical design, etc.

Additionally, in some embodiments, the table interface 310 may present multiple design state overviews to the user. In these cases each design state overview is associated with a different optical design. In this manner, a user may design in parallel different optical systems. Alternatively, a design state overview may display design information associated with different optical designs in the same design state overview.

FIG. 4 illustrates an example design state overview 400 according to one embodiment. Some of the rows in the design state overview 400 include a plurality of table entries that describe the corresponding specification. Table entries describing a particular specification are populated with the design information associated with the particular specification. In this embodiment, table entries for a specification include a description field 405, a mode field 410, a target field 415, a range field 420, a calculated value field 425, an active field value 430, or some combination thereof. Additionally, in some embodiments, the design state overview 400 may include other table entries. For example, a label set by a user, a specification identifier, etc. A specification identifier is a variable that uniquely identifies the associated specification. Additionally, one or more of the table entries may have values associated with a particular unit of measure (e.g., focal length may be listed in millimeters). In some embodiments, the units for one or more of the table entry values may be displayed (e.g., via a separate column or the description field 405 may include the units). In other embodiments, the units are not displayed. Additionally, in some embodiments, a user is able to select whether or not units are displayed for one or more table entry values included in the design state overview 400.

The description field 405 presents description information for an associated specification. For example, in FIG. 4, the description information associated with a magnification specification reads "Magnification." The target field 415 presents a target value for the associated specification. For example, in FIG. 4, the target value for the magnification specification is 1. The range field 420 presents a range in deviation (range value) from the target value presented in the target field 415. For example, in FIG. 4, the deviation from a magnification of 1 is +/−0.1. The calculated value field 425 presents the value of the associated specification as calculated by the optical design engine 125 (calculated value) based on the current design of the optical system. In FIG. 4, the calculated value is 1.04.

The mode field 410 indicates a condition as to how the values of the target field 415 and the range field 420, are to be compared to the value of the calculated value field 425. The mode field 410, may set a condition of, for example, equal to (=), not equal to (≠), greater than (>), or less than (<).

The requirement for a specification is met if a mode condition is satisfied. For example, in FIG. 4, the condition set by the mode field 410 is satisfied because the mode field for the magnification specification is set to '=' and the value of the calculated value field 425 (1.04) is within the range of values (1+/−0.1) established by the values in the target field 415 and the range field 420. Accordingly, the requirement for the magnification specification is met. Likewise, a specification is not met if the mode condition is not satisfied. For example, in FIG. 4, the mode condition for the RMS wavefront specification is not satisfied, because the calculated value of 1.2 is greater than 0.1. Accordingly, the RMS wavefront specification is not met.

The target state of the optical design is described by target ranges of the specifications. A target range is a value or range of values determined by the target field 415 and the range field 420. For example, in FIG. 4 there is no range associated with image clearance, only a target value of 30, accordingly its target range is the value 30. In contrast, the target range for the magnification has a range of values, specifically, 1+/−0.1. The current state of the optical design is described by the calculated value fields 425. Additionally, the target range may be a requirement or a soft requirement. A requirement must be met. A soft requirement ideally is met, but does not need to be met.

The active field 430 allows a user to select which of the specifications are active during the design process. The design state overview 400 may present a selectable interface for one or more of the specifications that allow a user to select whether a particular specification in the design state overview 400 is active. For example, in FIG. 4, the active field 430 includes a box where no check indicates that specification is not active, and a check indicates that specification is active. The table interface 310 stores the value of the active field 430 in an activity value that is part of the design information. In some embodiments, when a specification is inactive the specification guided optical design interface 135 may visually indicate to the user that the specification is inactive. For example, in FIG. 4, the design state overview interface has grayed out row 440. In some embodiments, the specification guided optical design interface 135 continues to update inactive specifications. In other embodiments, the specification guided optical design interface 135 does not update inactive specifications.

The table interface 310 may receive one or more table entries for the design state overview 400 from a user of the optical design workstation 100. The design state overview 400 includes an edit soft button 450. The edit soft button 450, after being selected, allows a user to add, edit, or delete rows in the design state overview 400. For example, a user may add a row associated with a new specification to the design state overview 400, including adding design information to one or more associated table entries (e.g., mode field 410, target field 415, range field 420). Additionally, after the edit soft button 450 is selected a user may edit the design information associated with one or more table entries. For example, a user may change a condition in the mode field 410, change a value in the target field 415, change a value in the range field 420, or some combination thereof. In alternate embodiments, the design state overview 400 does not include an edit soft button 450, but instead allows a user to edit one or more of the table entries at any time.

The table interface 310 updates the design state overview 400 based on changes made to the table entries of the design state overview 400. In some embodiments, the design state overview 400 includes an update soft button 455 and/or some other menu command that when selected, causes the table interface 310 to send design information associated with one or more specifications in the design state overview 400 to the optical design engine 125. For example, the table interface 310 may send design information including a specification identifier, a target field value, a range value, a mode condition, or some combination thereof to the optical design engine 125. The table interface 310 then receives some updated design information from the optical design engine 125. For example, the table interface 310 may receive calculated values and corresponding parameter identifiers that are associated with different specifications.

The table interface 310 updates the design state overview with the updated design information. The table interface 310 identifies which rows have updated design information using the received specification identifiers. The table interface 310 then updates one or more of the calculated value field(s) 425 with the calculated values and displays the updated design state overview 400 to the user.

In some embodiments, the table interface 310 flags any table entry of the design state overview whose calculated value does not meet the requirement for the specification. For example, when a condition set by the mode field 410 for a particular specification is not satisfied given the updated design information, the table interface 310 automatically flags one or more table entries associated with the specification. The table interface 310 may flag a table entry by, for example, highlighting, bolding, or in some way visually emphasizing one or more fields associated with the specification being flagged. In FIG. 4 the semi field of view specification has been flagged by graying out the calculated value 20.

In alternate embodiments, the design state overview 400 automatically updates one or more of the table entries associated with the calculated value field 425 after a user edits one or more table entries, adds a specification, removes a specification, or in some way changes the optical design.

In this example, the table interface 310 may receive a design command from the user. The design state overview 400 may include one or more soft buttons 445 that may be used to access different design commands. Design commands are commands which relate to different aspects of designing an optical system. Design commands may include, for example, find starting design, optimize, tolerance, or some combination thereof. Additionally, in some embodiments, one or more of the design commands may be accessed via some other user method (e.g., by menu or command line).

Alternatively, the design state overview 400 may not include the soft buttons 445 and instead allow the design commands to be accessed via some other method.

In some embodiments, the table interface 310 may determine and display a design process suggestion to facilitate further improvement of the current state of the optical design. The table interface 310 determines the suggestions based on the information in the design state overview 400. Suggestions may be, for example, executing a particular design command. Additionally, in some embodiments, suggestions may be based in part on what specifications users have selected to be part of the design state overview.

Referring back to FIG. 3, the initial design module 315 identifies one or more starting designs when a find starting design command 445 is selected. The initial design module 315 retrieves design information associated with one or more specifications from the design state overview. In one embodiment, the initial design module 315 sends an optical design request including the retrieved design information to the optical design archive 110. The initial design module 315 is configured to receive one or more candidate optical designs from the optical design archive 110. The received one or more optimized candidate optical designs may include additional specifications to those initially sent to the optical design engine 125.

In alternate embodiments, the initial design module 315 sends the retrieved one or more specifications to the optical design engine 125 that creates one or more candidate optical designs. The initial design module 315 then receives one or more candidate optical designs from the optical design engine 125.

The initial design module 315 presents a candidate optical design table that describes the one or more candidate optical designs received from the optical design engine 125. The candidate optical designs are described using design information associated with one or more specifications of the candidate optical design. In some embodiments, all of the one or more candidate optical designs are presented. In other embodiments, a subset of the one or more candidate optical designs is presented (e.g., three designs that most closely match the specifications). A user of the optical design workstation 100 may select one or more of the candidate optical designs. The initial design module 315 populates the design state overview with design information associated with each specification of a selected candidate optical design.

Figure 5:
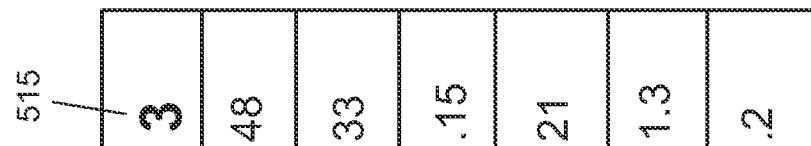
FIG. 5 illustrates an example candidate optical design table describing a plurality of candidate optical designs according to one embodiment.

FIG. 5 illustrates an example candidate optical design table 500 describing a plurality of candidate optical designs according to one embodiment. In this example, the table 500 includes three candidate optical designs 505, 510, and 515. For each of the candidate optical designs 505, 510, and 515 some of the design information associated with different specifications is presented. For example, table 500 presents a magnification of 1, 1.1, and 1.3, for optical designs 505, 510, and 515, respectively. In some embodiments, information associated with the target design may also be displayed as part of the table 500. Additionally, design information associated with other specifications may be included in table 500.

Referring back to FIG. 3, the optimization module 320 generates one or more optimization parameters using design information associated with one or more specifications. When an optimization design command is selected, the optimization module 320 retrieves, from the design state overview, design information associated with one or more specifications. The optimization module 320 generates one or more optimization parameters by converting the one or more specifications into either a suitable constraint format for automatic design optimization or into a suitable merit function for automatic design.

The optimization module 320 presents the one or more optimization parameters to a user of the optical design workstation 100. In some embodiments, the one or more optimization parameters are presented to the user as part of the design state overview. Alternatively, the one or more optimization parameters are presented in a separate table.

The user may modify the generated one or more optimization parameters. Modification may include adding to, deleting from, editing, or some combination thereof, the generated one or more optimization parameters. Once a user approves the one or more optimization parameters, the optimization module 320 sends an optimization request to the optical design engine 125. An optimization request includes the approved one or more optimization parameters and design information associated with one or more specifications. Additionally, in some embodiments, the optimization request may include design information associated with one or more specifications that are associated with multiple optical designs. The optimization module 320 receives updated design information from the optical design engine 125. The optimization module 320 automatically updates the design state overview and the optical design with the updated design information. Additionally, in embodiments where a candidate optical design table is being displayed, the optimization module 320 may automatically update the candidate optical design table with the updated design information.

The tolerance module 325 calculates tolerance recommendations using design information associated with one or more specifications retrieved from the design state overview. Tolerances may include physical dimensions for optical elements (manufacturing tolerances), such as center thickness, radius of curvature, element wedge, diameter, and surface irregularity; alignment tolerances such as tilt or decentration of elements or groups; material tolerances such as index of refraction or Abbe number (dispersion), and others. The tolerance module may 325 identify a tolerance grade value included within the design information of one or more specifications. A tolerance grade value identifies an acceptable range in the dimensions of optical elements defined by the one or more specifications. A tolerance grade value may be, for example, commercial grade (e.g., ±0.15 mm for center thickness, 2 fringes for surface irregularity, 5 arcmin for element wedge, etc.), precision grade (e.g., respective values of ±0.05 mm, 0.5 fringes, and 1 arcmin, etc.), or high-precision grade (e.g., respective values of ±0.025 mm, 0.2 fringes, 0.5 arcmin wedge, etc.). Additionally, in some embodiments, a user is able to customize one or more of the tolerance grade values and/or define new tolerance grade values.

The tolerance module 320 can calculate the performance of an ensemble of realizations of the optical system, where each realization is given random variations of the tolerances as specified by the tolerance grade (possibly with some tolerances modified by the user) and indicates to the user those cases where one or more tolerances need to be made tighter in order to meet a specification on the manufacturing yield. Alternatively, the tolerance module 320 can determine an allowable range of tolerances that are not based solely on tolerance grade but are designed to ensure that a yield specification is met. For example, the tolerance module 320 could choose upper and lower bounds for a tolerance based on the specified tolerance grade (or specific limits defined by the user). The tolerance module 320 then adjusts the value of each tolerance, staying within the specified upper and lower bounds, to produce a specific degradation in the performance.

The amount of estimated degradation associated with each tolerance is varied to try to achieve the specification for estimated as-built performance (or yield) as defined in the design state overview. In this process, if some or all tolerances reach their lower limits without having the ensemble achieve the desired manufacturing yield, the user can be informed and the manufacturing yield specification would not be met, or the user can allow some tolerances to be made tighter.

The tolerance module 320 presents the calculated tolerance recommendations to the user via, for example, the design state overview 400, or some other form of presentation (e.g., a separate table). Additionally, in some embodiments, the design state overview 400 may allow a user to toggle between displaying and not one or more tolerancing recommendations (e.g., via collapsible rows).

The tolerance module 320 receives one or more adjustments to the one or more tolerance recommendations from a user of the optical design workstation 100. In some embodiments, adjustments to the tolerance recommendations include selection of compensator information. Compensator information describes an adjustment that may be made to compensate for alignment or manufacturing tolerances. For example, the image plane axial location may often be adjusted to correct for, or partially correct for, the degradation in performance caused by errors in element center thickness, radii of curvature, element spacing, index of refraction, etc; this is often referred to as a focus compensator. More sensitive designs may require other compensators, such as a lateral adjustment of an element (perpendicular to the optical axis of the lens) to compensate for performance degradation resulting from, for example, element tilt, decentration, or wedge errors. Additionally, in some embodiments, numerous compensators are included simultaneously, such as focus, lateral and axial translations of elements, respacing along the axis of multiple elements, etc. The tolerance module 320 may use compensators defined in the design state overview. Or, the user might specify potential compensators and allow the tolerance module 320 to automatically determine which of those adjustments are the most effective.

The tolerance module 320 then provides the adjusted tolerance and possibly compensator recommendations to the optical design engine 125 to update the optical design. The tolerance module 320 receives updated design information from the optical design engine 125. The updated design information is presented to the user via, for example, the design state overview. Generally, if the updated design information is within specification the user approves the updated design information, via for example, a menu command. Although, in some instances a user may want to adjust the tolerance recommendations before approving them. In these cases, where the updated design information causes one or more of the specifications to no longer meet requirements, the user can further adjust the tolerance recommendations and/or modify any compensator definition information.

The report generator 335 generates optical design reports using design information from the design state overview. An optical design report describes the optical design. The report generator could be used at any stage of the design. For example, engineers often report feasibility or preliminary design results, which might not meet all specifications. The report may be used to indicate that the defined specifications are not achievable; to monitor progress during the design process, to summarize the final design, etc. A final optical design is a design that is within specification and tolerance.

The report generator 335 is configured to generate an optical design report when a generate report command is selected by a user of the optical design workstation 100. The generate report command may be, for example, a soft button, a menu command, or some other command interface. In some embodiments, a user of the optical design workstation 100 selects design information from the design state overview that the report generator 335 uses to generate an optical design report. For example, the report generator 335 may use the specifications selected as active to generate the optical design report. Additionally, in some embodiments, the report generator 335 may create one or more supporting figures to describe performance of the optical design using information in the design state overview. Additionally, the report generator 335 may automatically update one or more of the created figures based on changes to information in the design state overview. In alternate embodiments, the report generator 335 may include all of the specifications included in the design state overview to generate the optical design report.

FIG. 6 illustrates an example optical design report 600 describing an optical design according to one embodiment. The design report 600 includes, for example, a specification field 605, a requirements field 610, and a value field 615. The specification field 605 describes specifications for the optical design. The report generator 335 populates the specification field 605 using description information from the description field 405, design metadata, or some combination thereof. The requirements field 610 identifies the requirements for the specifications. In some embodiments, one or more of the requirements may be soft requirements. The report generator 335 populates the requirements field 610 with target values from the target value field 415, range values from the range field 420, design metadata, or some combination thereof. The value field 615 identifies the calculated values associated with the specifications. The report generator 335 populates the value field 615 with calculated values from the calculated value field 425.

The report generator 335 presents the optical design report 600 to the user of the optical design workstation 100. In some embodiments, the report generator 335 provides an option to the user to export the optical design report. The optical design report 600 may be exported in one or more standard formats. For example, the design report may be exported as an EXCEL file, a PDF file, a WORD document, etc.

Figure 7:
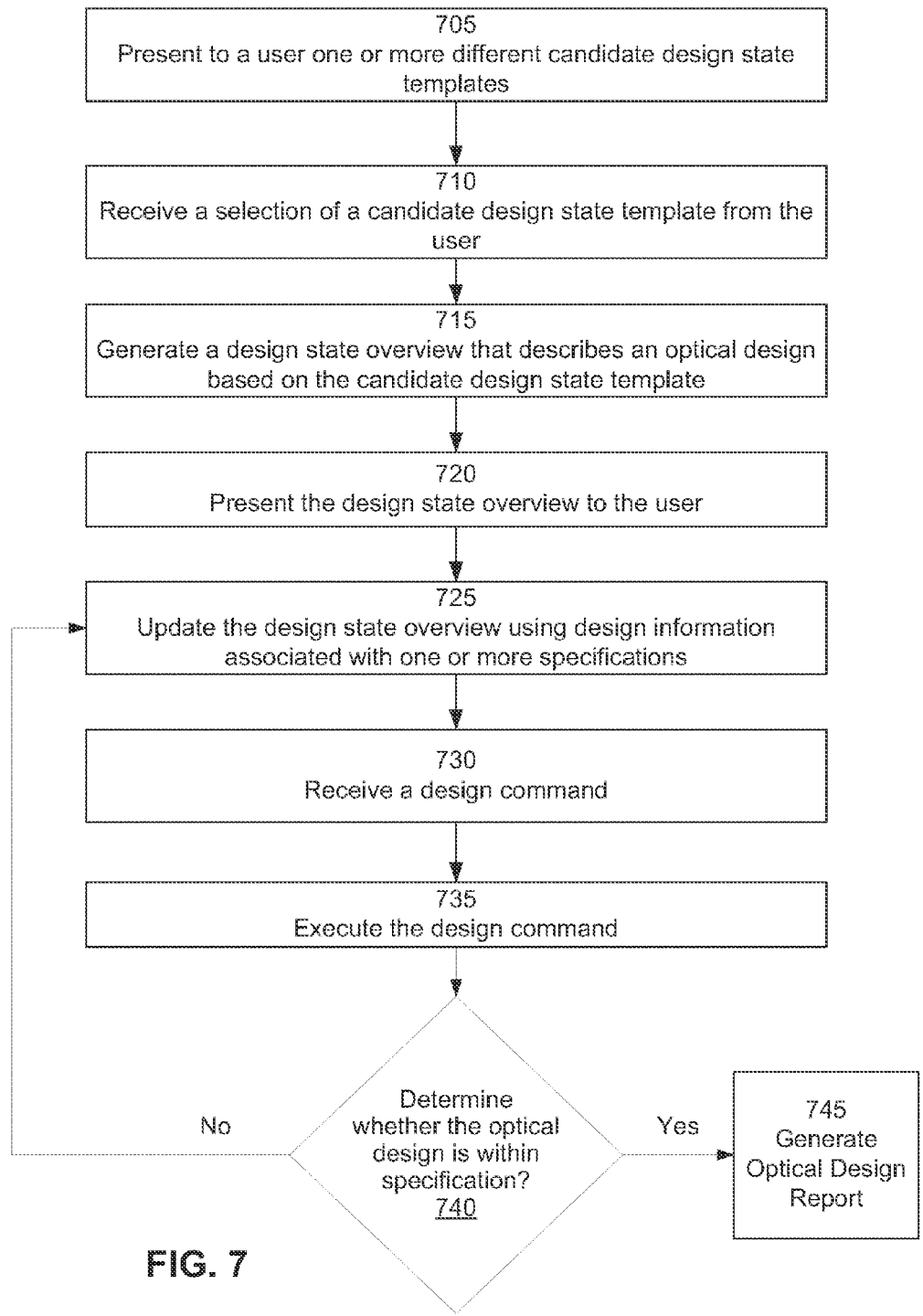
FIG. 7 is a flowchart illustrating an optical design process utilizing a specification guided optical design interface according to one embodiment.

FIG. 7 is a flowchart illustrating an optical design process utilizing a specification guided optical design interface according to one embodiment. In one embodiment, the process of FIG. 7 is performed by the optical design workstation 100. Other entities may perform some or all of the steps of the process in other embodiments. Likewise, embodiments may include different and/or additional steps, or perform the steps in different orders.

In this embodiment, the optical design workstation 100 presents 705 to a user one or more different candidate design state templates. The optical design workstation 100 receives 710 a selection of a candidate design state template from the user. In alternate embodiments, the user selects one or more specifications to be included in the design state overview.

The optical design workstation 100 generates 715 a design state overview that describes an optical system based on the candidate design state template. The optical design workstation 100 presents 720 the design state overview to the user. The user may populate one or more table entries of the design state overview with design information. For example, the user may provide target range values for one or more specifications.

The optical design workstation 100 updates 725 the design state overview using design information associated with one or more specifications. For example, the optical design workstation 100 updates one or more calculated values using corresponding specification identifiers, target field values, range values, mode conditions, or some combination thereof. The optical design workstation 100 updates the design state overview with the calculated values.

In some embodiments, the design state overview is updated via a command received from a user (e.g., execution of a soft update button). In alternate embodiments, the optical design workstation 100 automatically updates one or more of the table entries after a user edits one or more table entries, adds a specification, removes a specification, or in some way changes the optical design.

The optical design workstation 100 receives 730 a design command. The optical design workstation 100 executes the design command 735. The execution of different types of design commands is discussed in detail below with reference to FIGS. 8-10.

Once the design command has been executed, the optical design workstation 100 determines 740 whether the optical design is within specification. In some embodiments, the optical design workstation determines whether the optical design is within specification automatically. In other embodiments, the optical design workstation 100 receives a command from the user indicating that the optical design is within specification. If the optical design is outside of specification the process moves to step 725. If the optical design is within specification the optical design workstation generates 745 an optical design report.

Figure 8:
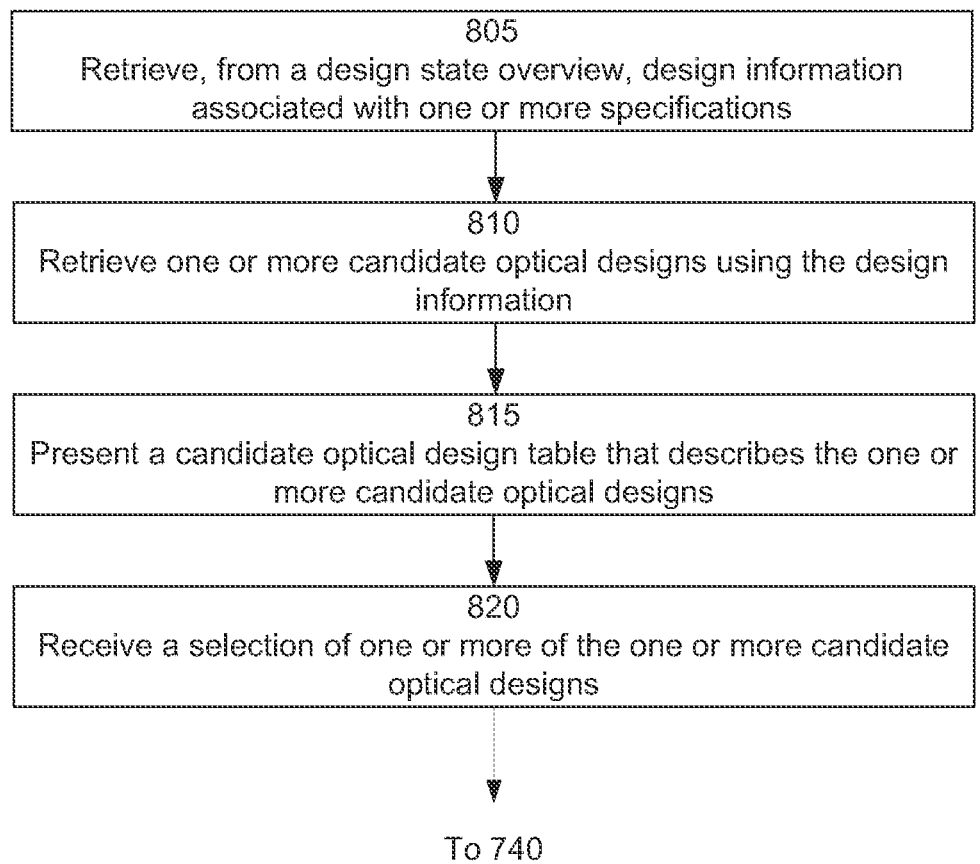
FIG. 8 is a flowchart illustrating a process executing a find starting design command using a specification guided optical design interface according to one embodiment.

FIG. 8 is a flowchart illustrating a process executing a find starting design command using a specification guided optical design interface according to one embodiment. In one embodiment, the process of FIG. 8 is performed by the optical design workstation 100. Other entities may perform some or all of the steps of the process in other embodiments. Likewise, embodiments may include different and/or additional steps, or perform the steps in different orders.

In one embodiment, the optical design workstation 100 retrieves 805, from a design state overview, design information associated with one or more specifications.

The optical design workstation 100 retrieves 810 one or more candidate optical designs using the design information. In one embodiment, the one or more candidate optical designs are retrieved from the optical design archive 110 or the optical design store 130. Alternatively, the one or more candidate optical designs may be calculated by the optical design workstation 100.

The optical design workstation 100 presents 815 a candidate optical design table describing the one or more candidate optical designs. The candidate optical designs are described using design information associated with one or more specifications of the candidate optical design. The optical design workstation 100 receives 820 a selection of one or more of the one or more candidate optical designs. The process then moves to step 740 as described above with reference to FIG. 7.

Figure 9:
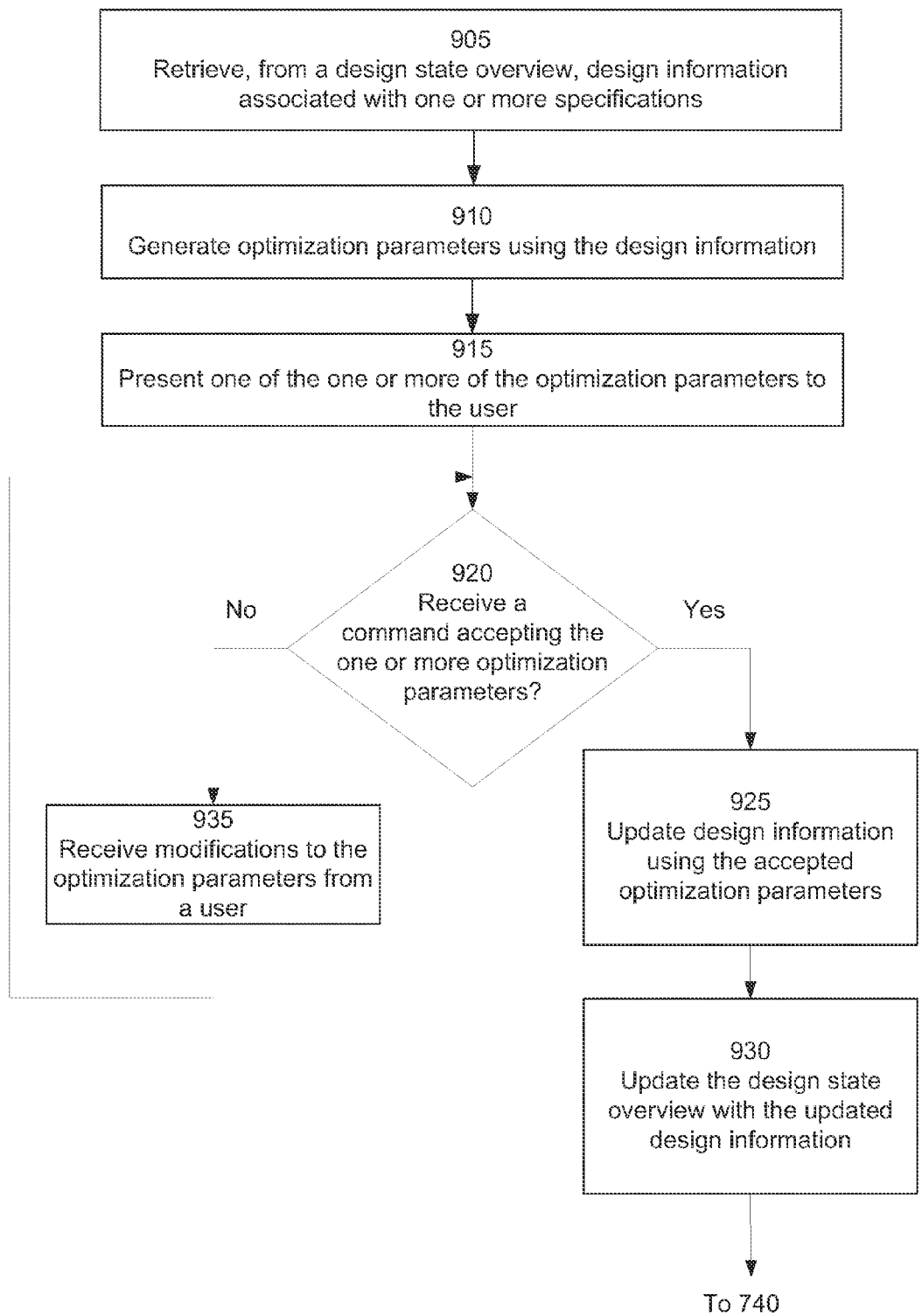
FIG. 9 is a flowchart illustrating a process executing an optimization design command using a specification guided optical design interface according to one embodiment.

FIG. 9 is a flowchart illustrating a process executing an optimization design command using a specification guided optical design interface according to one embodiment. In one embodiment, the process of FIG. 9 is performed by the optical design workstation 100. Other entities may perform some or all of the steps of the process in other embodiments. Likewise, embodiments may include different and/or additional steps, or perform the steps in different orders.

In one embodiment the optical design workstation 100 retrieves 905, from a design state overview, design information associated with one or more specifications. The optical design workstation 100 generates 910 optimization parameters using the design information and presents 915 one or more of the optimization parameters to the user.

The user may accept or reject the generated optimization parameters. The optical design workstation 100 may receive 920 a command accepting the one or more optimization parameters. For example, a user may accept the one or more optimization parameters via a menu command, soft button, etc. If the one or more optimization commands are accepted, the optical design workstation 100 updates 925 design information using the accepted optimization parameters. The optical design workstation then updates 930 the design state overview with the updated design information and the process moves to step 740 as described above with reference to FIG. 7. If the one or more optimization commands are not accepted by the user, the optical design workstation 100 may receive 935 modifications to the optimization parameters from the user, and the process moves to step 920 as described above.

Figure 10:
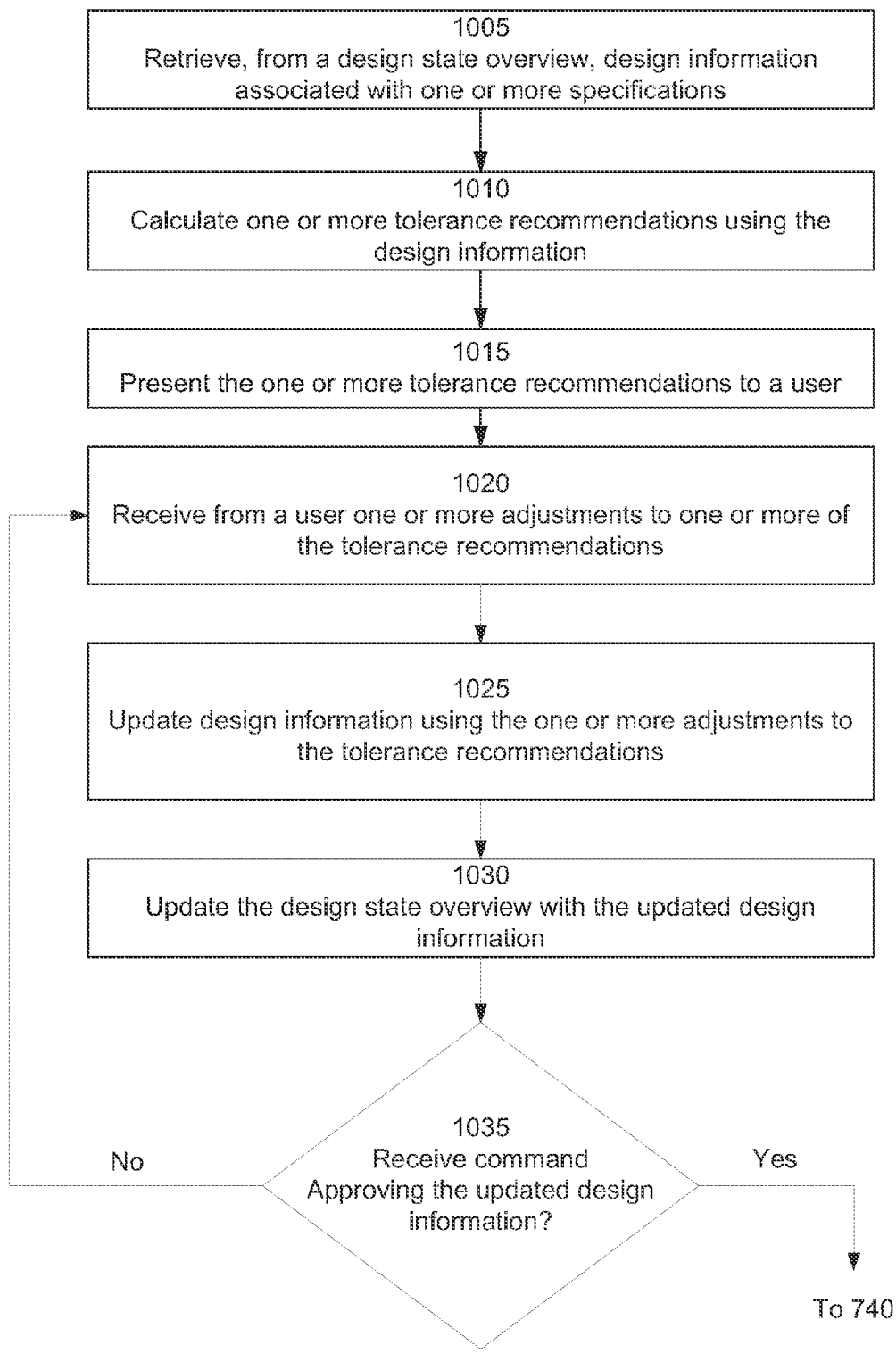
FIG. 10 is a flowchart illustrating a process executing a tolerance design command using a specification guided optical design interface according to one embodiment.

FIG. 10 is a flowchart illustrating a process executing a tolerance design command using a specification guided optical design interface according to one embodiment. In one embodiment, the process of FIG. 10 is performed by the optical design workstation 100. Other entities may perform some or all of the steps of the process in other embodiments. Likewise, embodiments may include different and/or additional steps, or perform the steps in different orders.

In one embodiment, the optical design workstation 100 retrieves 1005, from a design state overview, design information associated with one or more specifications. The optical design workstation 100 calculates 1010 one or more tolerance recommendations using the design information and presents 1015 the one or more tolerance recommendations to a user.

The optical design workstation 100 receives 1020 from a user one or more adjustments to one or more of the tolerance recommendations. The optical design workstation 100 updates 1025 design information using the one or more adjustments to the tolerance recommendations. The optical design workstation 100 updates 1030 the design state overview with the updated design information.

A user reviewing the design state overview may approve the updated design information. The optical design workstation 100 may receive 1035 a command approving the updated design information. If the updated design information is approved, the process moves to step 740 as described above with reference to FIG. 7. If the updated design information is not approved by the user, the process moves to step 1020 as described above.

Figure 11:
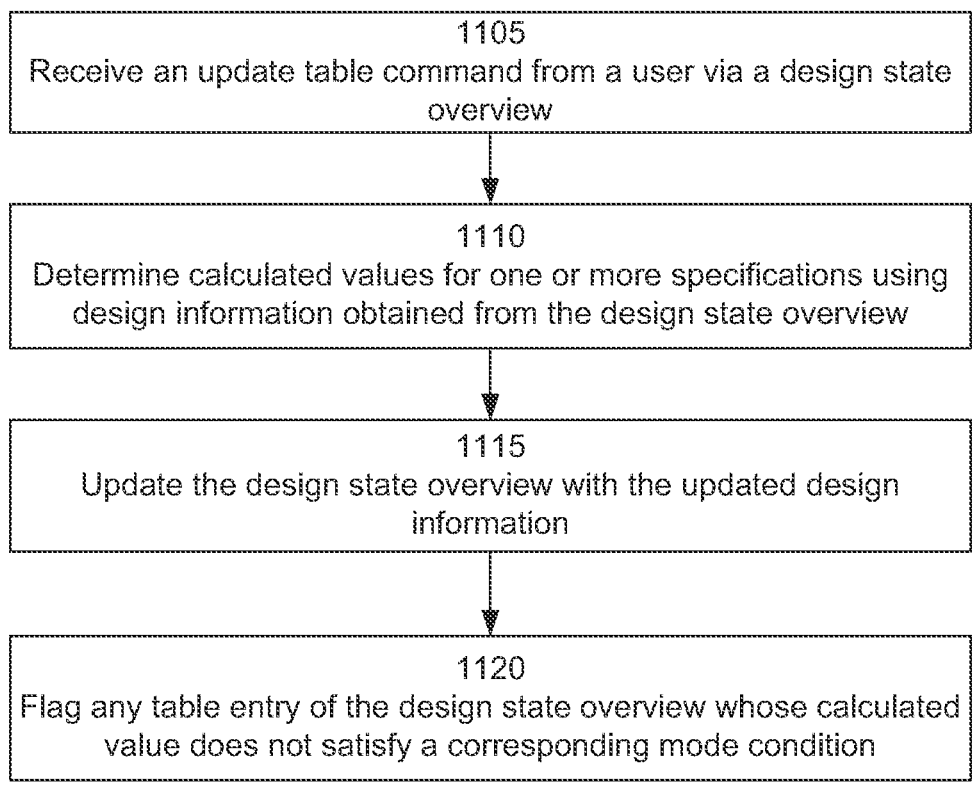
FIG. 11 is a flowchart illustrating a process of updating a design state overview according to one embodiment.

FIG. 11 is a flowchart illustrating a process of updating a design state overview according to one embodiment. In one embodiment, the process of FIG. 11 is performed by the optical design workstation 100. Other entities may perform some or all of the steps of the process in other embodiments. Likewise, embodiments may include different and/or additional steps, or perform the steps in different orders.

In one embodiment the optical design workstation 100 receives 1105 an update table command from a user via a design state overview. The optical design workstation 100 determines 1110 calculated values for one or more specifications using design information obtained from the design state overview. The optical design workstation 100 updates 1115 the design state overview with the updated design information.

The optical design workstation 100 flags 1120 any table entry of the design state overview whose calculated value does not satisfy a corresponding mode condition.

Some portions of the above description describe the embodiments in terms of algorithmic processes or operations.

These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof. In one embodiment, a software module is implemented with a computer program product comprising a non-transitory computer-readable medium containing computer program code, which can be executed by a computer processor for performing any or all of the steps, operations, or processes described.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for generating a design state overview. Thus, while particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed herein.

The invention claimed is:

1. A method for designing an optical system using a optical design system implemented on a computer system, the method comprising the optical design system performing the steps of:
    generating a design state overview of the design of the optical system, the design state overview summarizing a current state and a target state of the design by describing a plurality of specifications for the optical system, the specification descriptions including target ranges for the specifications based on the target state of the design and further including current values for the specifications based on the current state of the design, and the specification descriptions include a comparison condition between a combination of a target range, a target state and a current value associated with the specification;
    displaying the design state overview; and
    updating, by a processor, the design state overview in response to the optical design system changing the current design for the optical system and visually emphasizing one or more specifications based in part on a comparison condition.

2. The method of claim 1 wherein displaying the design state overview comprises displaying the design state overview in a table format having rows and columns, the rows displaying different specifications and the columns displaying the current state and the target state of the design.

3. The method of claim 1 wherein the optical design system further performs the step of determining and displaying a design process suggestion to facilitate further improvement of the current state of the design, the design process suggestion based on information in the design state overview.

4. The method of claim 3 wherein the design process suggestion includes a suggestion for a design command to be performed on the design.

5. The method of claim 4 wherein the suggested design command can be initiated from the design state overview.

6. The method of claim 4 wherein the suggested design command can be initiated from outside the design state overview.

7. The method of claim 6 wherein the suggested design command can be initiated from a command line interface.

8. The method of claim 3 wherein the design process suggestion includes a suggestion for an optimization process to be applied to the design.

9. The method of claim 8 wherein the optical design system further performs the step of constructing an optimization parameter for the optimization process based on information in the design state overview.

10. The method of claim 8 wherein the optical design system further performs the step of constructing a merit function for the optimization process based on information in the design state overview.

11. The method of claim 8 wherein the optical design system further performs the step of constructing a constraint for the optimization process based on information in the design state overview.

12. The method of claim 3 wherein the optical design system further performs the step of receiving a user selection of which specifications are to be involved in the design process suggestion, wherein the design process suggestion is further based on the user selection.

13. The method of claim 12 wherein displaying the design state overview comprises visually indicating the user selection in the design state overview.

14. The method of claim 1 wherein the optical design system further performs the step of calculating and displaying a tolerance recommendation for the design, the tolerance recommendation based on information in the design state overview.

15. The method of claim 1 wherein the optical design system further performs the step of receiving a user selection of which specifications are to be included in the design state overview.

16. The method of claim 1 wherein the optical design system further performs the step of receiving a user definition of a target range for a specification.

17. The method of claim 1 wherein the optical design system further performs the steps of:
presenting one or more candidate design state templates for the design state overview; and
receiving a user selection of a design state template from among the candidate design state templates, wherein the generating the design state overview is based on the selected design state template.

18. The method of claim 17 wherein the optical design system further performs the steps of:
receiving a user identification of a type for the optical system; and
selecting candidate design state templates based on the identified type.

19. The method of claim 1 wherein the optical design system further performs the steps of: determining and displaying an initial design of the optical system, the initial design based on information in the design state overview.

20. The method of claim 1 wherein the optical design system further performs the steps of:
determining and displaying at least two candidate initial designs of the optical system, the candidate initial designs based on information in the design state overview; and
receiving a user selection of one of the candidate initial designs.

21. The method of claim 1 further comprising:
generating an optical design report using design information in the design state overview.

22. The method of claim 1 wherein displaying the design state overview comprises visually indicating if a specification is outside its target range.

23. The method of claim 1 wherein additional specifications are added to the design state overview as the design process progresses.

24. The method of claim 1 wherein the plurality of specifications includes specifications for a first order design of the optical system.

25. The method of claim 1 wherein the plurality of specifications includes specifications beyond those in a first order design of the optical system.

26. The method of claim 1 wherein the plurality of specifications includes specifications that depend on a type of the optical system.

27. The method of claim 1 wherein the plurality of specifications includes specifications that are specific to a type of the optical system.

28. The method of claim 1 wherein the plurality of specifications includes a majority of the specifications needed to describe the state of an optical design.

29. The method of claim 1 wherein the plurality of specifications includes substantially all the specifications needed to describe the state of an optical design.

30. The method of claim 1 wherein the plurality of specifications includes all of the specifications needed to describe the state of an optical design.

31. The method of claim 1 wherein the plurality of specifications includes at least one optical image quality specification selected from the group of: transverse ray aberration, spot size, wavefront error, Zernike coefficient(s) associated with the wavefront(s), MTF, encircled energy diameter, fiber coupling efficiency, field curvature, and distortion.

32. The method of claim 1 wherein the plurality of specifications includes at least one optical image quality specification selected from the group of: efficiency, surface finish, material properties, tolerance restrictions, and a measure of optical performance.

33. The method of claim 1 wherein the plurality of specifications includes at least one mechanical specification selected from the group of: length, diameter, working distance, and weight.

34. The method of claim 1 wherein the plurality of specifications includes at least one environmental specification selected from the group of: operating temperature range, pressure, and medium.

35. The method of claim 1 wherein the plurality of specifications includes at least one manufacturing specification.

36. The method of claim 1 wherein at least one target range is a soft requirement.

37. The method of claim 1 wherein at least one target range is meeting a target value.

38. A non-transitory computer-readable storage medium storing executable computer program instructions for designing an optical system using an optical design system implemented on a computer system, the instructions executable by the computer system to perform steps comprising
generating a design state overview of the design of the optical system, the design state overview summarizing a current state and a target state of the design by describing a plurality of specifications for the optical system, the specification descriptions including target ranges for the specifications based on the target state of the design and further including current values for the specifications-based on the current state of the design, and the specification descriptions include a comparison condition between a combination of a target range, a target state and a current value associated with the specification;
displaying the design state overview; and
updating, by a processor, the design state overview in response to the optical design system changing the current design for the optical system and visually emphasizing one or more specifications based in part on a comparison condition.

39. A system for designing an optical system using an optical design system, comprising:
a processor configured to execute modules; and
a memory storing the modules, the modules comprising:
a table interface module configured to:
generate a design state overview of the design of the optical system, the design state overview summarizing a current state and a target state of the design by describing a plurality of specifications for the optical system, the specification descriptions including target ranges for the specifications based on the target state of the design and further including current values for the specifications based on the current state of the design, and the specification descriptions include a comparison condition between a combination of a target range, a target state and a current value associated with the specification, display the design state overview, and update, by a processor, the design state overview in response to the optical design system changing the current design for the optical system and visually emphasizing one or more specifications based in part on a comparison condition.

* * * * *